United States Patent [19]

D'Agostini et al.

[11] 4,361,870

[45] Nov. 30, 1982

[54] MICROPROCESSOR CIRCUIT PROVIDING VEHICLE PARAMETER TEST DATA

[75] Inventors: Armond N. D'Agostini, Springfield, Pa.; Richard W. Dye, Jr., Port Orange, Fla.

[73] Assignee: The Boeing Company, Seattle, Wash.

[21] Appl. No.: 178,199

[22] Filed: Aug. 14, 1980

[51] Int. Cl.$^3$ .................. G06F 15/20; B60L 3/00
[52] U.S. Cl. .................. 364/424; 73/117.2
[58] Field of Search .......... 364/424, 425, 426, 431; 73/117.2, 117.3

[56] References Cited

U.S. PATENT DOCUMENTS

| | | | |
|---|---|---|---|
| 4,031,363 | 6/1977 | Freeman et al. | 364/424 |
| 4,072,850 | 2/1978 | McGlynn | 364/424 |
| 4,155,116 | 5/1979 | Tawfik et al. | 364/424 X |
| 4,204,255 | 5/1980 | Cremer | 364/425 |
| 4,212,064 | 7/1980 | Forsythe et al. | 364/424 |
| 4,234,921 | 11/1980 | Kinoshita et al. | 364/424 |
| 4,236,215 | 11/1980 | Callahan et al. | 364/424 X |
| 4,258,421 | 3/1981 | Juhasz et al. | 364/424 |
| 4,266,273 | 5/1981 | Dobler et al. | 364/424 X |

Primary Examiner—Edward J. Wise
Attorney, Agent, or Firm—Jones, Tullar & Cooper

[57] ABSTRACT

The microprocessor production instrumentation package (MPIP) is an electronic testing device used in railway vehicles operated on a test track to insure that the vehicles meet rigid operational specifications. The testing device provides vehicle data regarding axle speed, brake pressure, motor armature and field currents, acceleration, etc., in a time-saving manner. The self-calibrating MPIP provides permanent data curves from an oscillograph and a paper tape print-out of the vehicle data as it is generated. The testing device is powered by the vehicle's DC supply and is small enough to be hand-carried onto the vehicle.

11 Claims, 15 Drawing Figures

MPIP BLOCK DIAGRAM

THUMB WHEEL BOARD

FIG. 8 SPEED BOARD

FIG. 9 SPEED BOARD

ANALOG BOARD

FIG.11 ANALOG BOARD

FIG.13 CONTROL BOARD

POWER FAIL BOARD

MICROPROCESSOR CIRCUIT PROVIDING VEHICLE PARAMETER TEST DATA

BACKGROUND OF THE INVENTION

Initially all production acceptance testing for surface transportation vehicles was accomplished using conventional analog instrumentation. The instrumentation; consisting of signal conditioning, power supplies, calibration sources, and oscillographs, was contained in a two-bay equipment enclosure. The instrumentation's weight and physical size necessitated the use of forklift installation onto the test vehicle.

Operation of the instrumentation required a pre-test temperature stabilization and calibration of forty-five minutes, and the recording oscillograph data during testing. Post test oscillograph data reduction, necessary to satisfy all vehicle acceptance criteria, required approximately six hours to complete. Projecting these tasks and man hours over a production run of 550 vehicles emphatically showed that a more efficient method had to be developed for production acceptance testing.

A more effective method is described in a paper entitled "Application of the Microprocessor to Surface Transportation Vehicle Testing", published on May 2, 1978 by The Instrument Society of America. This paper contained a non-specific disclosure of the broad aspects of Applicants' invention.

The publication discloses components boards such as analog, speed, and control boards, and that some boards receive information from other boards. There is no specific description of what information is received or exchanged, nor is there an adequate disclosure of the electronic elements contained in the boards.

It is well known in the art to test vehicle parameters, but not in the manner of the present invention. The interrelation of the electronic circuit boards as specifically disclosed in the application yields a compact, precise and time-saving vehicle parameter testing device. Even though the board aspects of the invention have been published, the intermediate and specific aspects not disclosed are deemed patentable over the publication.

OBJECT AND SUMMARY OF THE INVENTION

The microprocessor production instrumentation package (MPIP) consists of a microprocessor unit, an oscillograph, a DC to AC inverter, a set of transducers, and transducer cables. During operation, the microprocessor unit and oscillograph are placed on the test vehicle floor. Line power for the microprocessor unit and the oscillograph, 120 volts AC, is obtained from the DC to AC inverter which is connected to the vehicles 37.5 volt DC supply. Acceptance parameter measuring transducers are installed on the test vehicle and connected to the microprocessor unit by means of transducer cables. The test engineer communicates with the microprocessor unit through the use of front panel controls-thumbwheel and pushbutton switches. System messages and acceptance data in engineering units are generated by the microprocessor unit and presented in printed type format on 2¼ inch wide paper tape. The microprocessor unit also commands the oscillograph to generate a record of all transducer signals for each test.

MPIP was designed to meet the demands of economic surface transportation vehicle acceptance testing. By virtue of its size and weight MPIP eliminates the problem associated with the conventional instrumentation installation. Temperature stabilization and calibration time is reduced to less than one minute. Acceptance data is presented in engineering units to the test engineer as it is being generated by the vehicle on the test track. Acceleration, deceleration, jerk rate, master controller position, line voltage, motor field and armature currents, truck brake pressure, and axle speed production acceptance data is produced by MPIP.

Accordingly, the objects of the present invention are to provide a vehicle parameter testing device that is (1) small enough to be hand-carried onto the test vehicle, (2) powered by the supply available on the test vehicle, (3) self-calibrating to zero, (4) capable of providing a permanent record of data as generated on a printer or oscillograph, (5) performed in a substantially time-saving manner.

The invention will be better understood, and further objects and advantages thereof will become more apparent from the ensuing detailed description of preferred embodiments taken in conjunction with the drawings.

DESCRIPTION OF THE PREFERRED EMBODIMENTS

The microprocessor unit is contained in a 17 inch × 17 inch × 12 inch aluminum suitcase and weighs approximately forty pounds. It is comprised of operator controls, the microprocessor, special function circuitry, a power supply and a printer shown in FIG. 2.

The vehicle parameter testing device is built around a Digital Equipment Corporation LSI-11 16 bit microprocessor. A Floating Point Instruction Set microm chip extends the LSI-11 instruction set to include fixed and floating point arithmetic functions. Program storage is provided by 4096 word by 16 bit core read/write memory which is non-volatile yet easily accommodates program changes. Input/output communication with the LSI-11 is accomplished by a parallel, a serial and an A to D/D to A interface. The parallel interface consists of a 16 bit input register, a 16 bit output register and a 4 bit control/status register. Thumbwheel, pushbutton, vehicle axle speed and master control loop command code information are routed to the microprocessor via the parallel interface. The serial interface consists of an 8 bit serial input and output register with provisions for bit rate selection. The serial interface has two functions. Primarily it connects the microprocessor to the data printer. It also permits a standard teletype to be connected to the microprocessor for paper tape program loading and internal processor register interrogation. The third interface is a data acquisition sub-system consisting of a 16 channel analog multiplexer, a programmable gain amplifier, a sample and hold, a 12 bit analog-to-digital converter and a 12 bit digital-to-analog converter. Conditioned analog vehicle test data signals are brought into the microprocessor through this third interface and it is used to convert the master control loop command digital code into an analog signal for the oscillograph. Physically the microprocessor, microm chip, core memory and three interfaces are contained on five printed circuit boards. The boards are mounted, powered, and interconnected by means of a backplane/card guide assembly.

Figure 1:
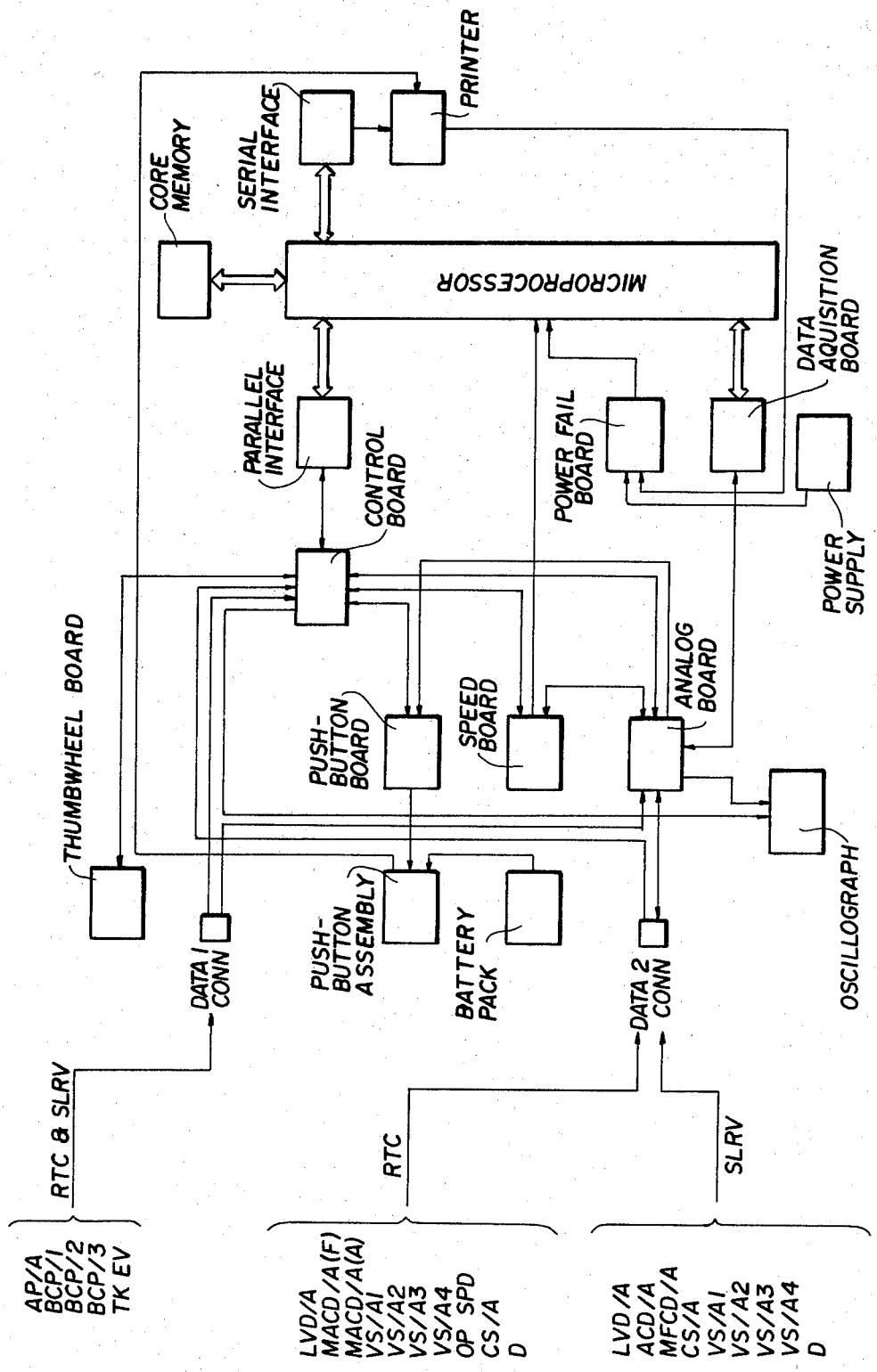
FIG. 1 is a block diagram of the present invention.

The parameters presented in engineering units for a first vehicle (Rapid Transit Car RTC for example) testing are: longitudinal acceleration, master control loop command and direction. The parameters recorded on the oscillograph for a first vehicle testing are: longitudinal acceleration (AP/A), master control loop command (CS/A), line voltage (LVD/A), forward and aft motor armature current (MACD/F, MACD/A) and four axle speeds (VS/A1-VS/A4). Also, a digital readout of vehicle speed is provided to the vehicle operator in the operator cab. Parameters presented in engineering units for a second vehicle (Standard Light Rail Vehicle SLRV for example) testing are: longitudinal acceleration, master control loop command, truck brake pressure, line voltage, motor armature current, motor field current, axle speed, direction, time to 600 feet, jerk rate and deceleration rate. The parameters recorded on the oscillograph for the second vehicle testing are: longitudinal acceleration (AP/A), master control loop command (CS/A), three truck brake pressures (BCP/A1, BCP/A2 and BCP/A3), line voltage (LVD/A), motor armature current (MACD/A), motor field current (MFCD/A), and four axle speeds (VS/A1-VS/A4). See the block diagram of FIG. 1.

Two sets of sensors are used to measure vehicle parameters and provide respective signals to the microprocessor. One set (Rapid Transit Car) consists of an accelerometer, a master control loop cable, magnetic pickups, a current transducer and a voltage transducer. The other set (Standard Light Rail Vehicle) consists of an accelerometer, pressure transducers, and an electronic control unit cable.

The acceleration sensor used to measure longitudinal acceleration of all vehicles (Rapid Transit Car, Standard Light Rail Vehicle) is a Columbia Research Inc. Force Balance Accelerometer. The accelerometer has a ±1.0 g range, 140 Hz natural frequency and a 0.64 critical damping. The accelerometer signal is filtered by a Fourth Order Low-Pass Butterworth filter with a cutoff frequency of 3.3 Hz and a roll-off of 24 decibels/octave. The accelerometer is placed on the vehicle floor during testing. Calibration is accomplished under microprocessor control by means of the current injection method. The calibration equivalent is ±3.992 MPHPS with an accuracy of ±1%.

The master control loop cable is connected to the Rapid Transit Car logic to sense master control loop command and vehicle direction. The logic levels are decoded by the microprocessor.

The four axle speeds for each Rapid Transit Car are sensed by Electro Corporation magnetic pickups. One pickup is placed into a receptacle on each axle gear box where it senses the rotation of a 105 tooth gear. The four speed sensors are automatically calibrated by the microprocessor. The calibration equivalent is 47.6 MPH with an accuracy of ±0.0001%.

The current transducer for the Rapid Transit Car was designed for the microprocessor application. It consists of two identical isolation/amplification circuits—one for forward motor armature current, the other for aft motor armature current. The circuits utilize Burr-Brown optically coupled amplifiers and isolated DC to DC power supply converters. These components insure complete isolation of the microprocessor system from the 600 volt DC motor armature circuits. The transducer circuitry is packaged in a small non-conductive case and is connected to the armature current-shunt receptacles in the vehicle operators cab. Each shunt gives an output of 100 mv for 600 amps. Transducer calibration is provided by a ±0.1% accurate millivolt source under microprocessor control. The calibration equivalent is 800 amps for both forward and aft motor armature current.

The voltage transducer for the Rapid Transit Car was designed similar to the current transducer. It consists of the same isolation/amplification circuit. The transducer provides complete electrical isolation of the microprocessor system from the 600 volt DC vehicle power supply. The voltage transducer is connected to the vehicle at the train phone fuse box. It is automatically calibrated by the microprocessor with a calibration equivalent of 600 volts ±0.1%.

The pressure transducers for the Standard Light Rail Vehicle are Standard Controls Inc. units with a range of 0 to 1000 PSI (1500 PSI proof) and a sensitivity of 3 mv/v. Three transducers are required for testing each car. They are connected to their respective pressure lines by means of a "snap-tight" quick disconnect fitting. The pressure transducers are calibrated by the microprocessor using a resistance calibration method with an accuracy of ±0.1%. The calibration equivalents for BCP/1, BCP/2, and BCP/3 are 1000 PSI, 977.2 PSI and 949.4 PSI, respectively.

The electronic control unit cable is used to obtain signals for nine parameters from the Electronic Control Unit (ECU) on the Standard Light Rail Vehicle. The parameters are: line voltage, motor armature current, motor field current, master control loop command, four axle speeds and vehicle direction. Buffer resistors and low capacitance cable is used in connecting the ECU signals to the microprocessor to provide short circuit protection and reduce signal loading. All parameters are automatically calibrated by the microprocessor using ±0.1% precision voltage sources.

Six special-function printed circuit boards were designed to adapt the microprocessor to surface transportation vehicle testing. The boards perform the following functions: condition all transducer signals, provide a precision calibration source, activate alarms for invalid test conditions, generate time pulses, and sequence the microprocessor when power fails. They are identified as the thumbwheel board, pushbutton board, speed board, analog board, control board and power fail board. The boards are mounted, powered and interconnected by means of a backplane/card guide assembly.

Figure 5:
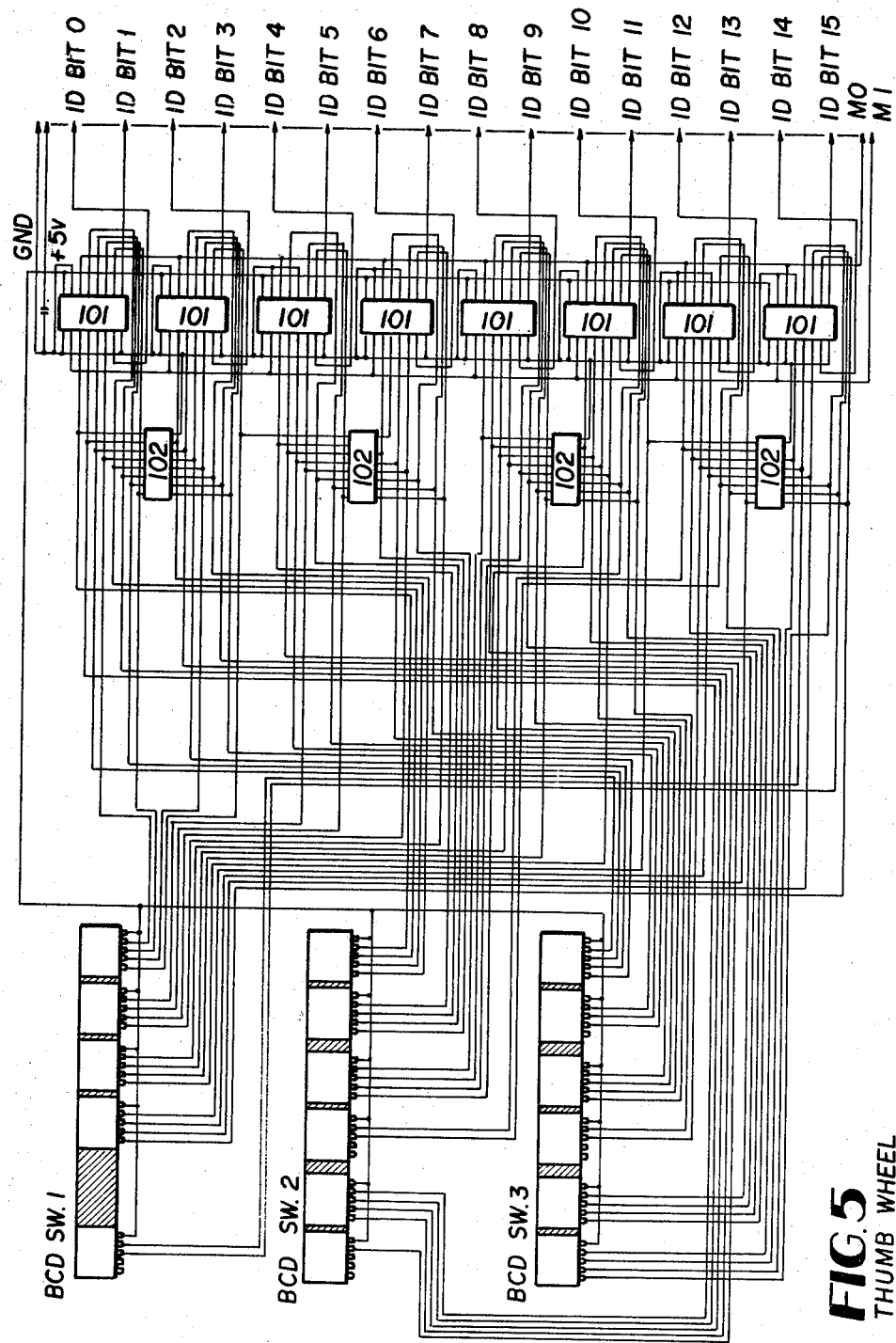
FIG. 5 is a schematic of the thumbwheel board.

The thumbwheel board has the thumbwheel switches soldered directly to it forming an assembly which is mounted to the front panel of the microprocessor unit. The switches of FIG. 5 are formated in binary coded decimal and require 58 bits to decode vehicle identification, date, time and run number. A digital multiplexer, comprised of chips 101, is located on the thumbwheel board and is used to segregate the BCD information into four words no larger than 16 bits. These four words are input to the microprocessor via the parallel interface input register. Word selection is controlled by 2 bits of the parallel interface output register.

Figure 2:
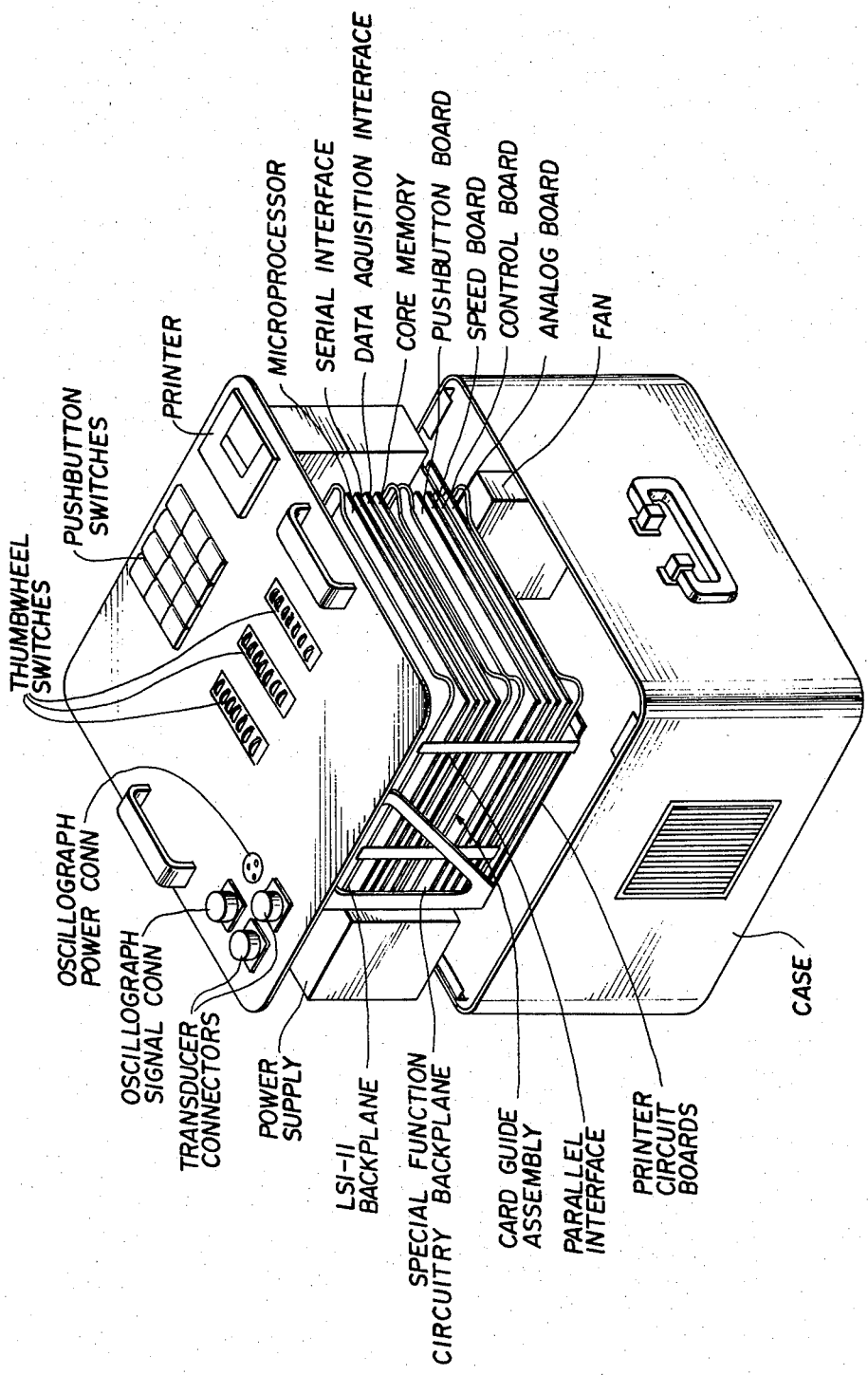
FIG. 2 shows the physical layout of the present invention.
Figure 3:
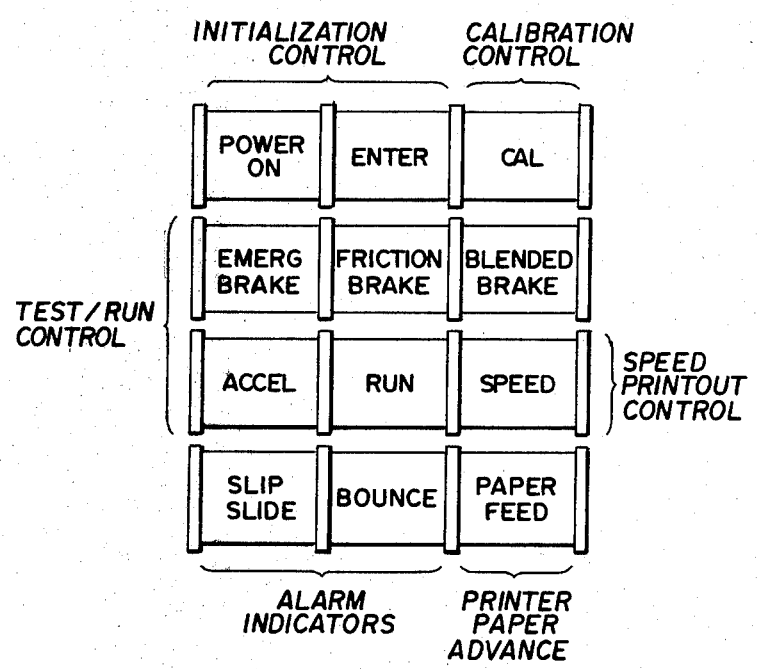
FIG. 3 indicates the pushbutton arrangement.

The operator controls consist of three rows of thumbwheel switches and twelve illuminated pushbutton switches, see FIGS. 2 and 3. Vehicle identification, test date, test start time and test run numbers are input to the microprocessor via the thumbwheels. Power up, system commands and test type selection are accomplished by means of the pushbuttons. Under software command, hardware illuminates the pushbuttons in operational sequence to guide the test engineer through a complete set of vehicle acceptance tests.

Figure 6:
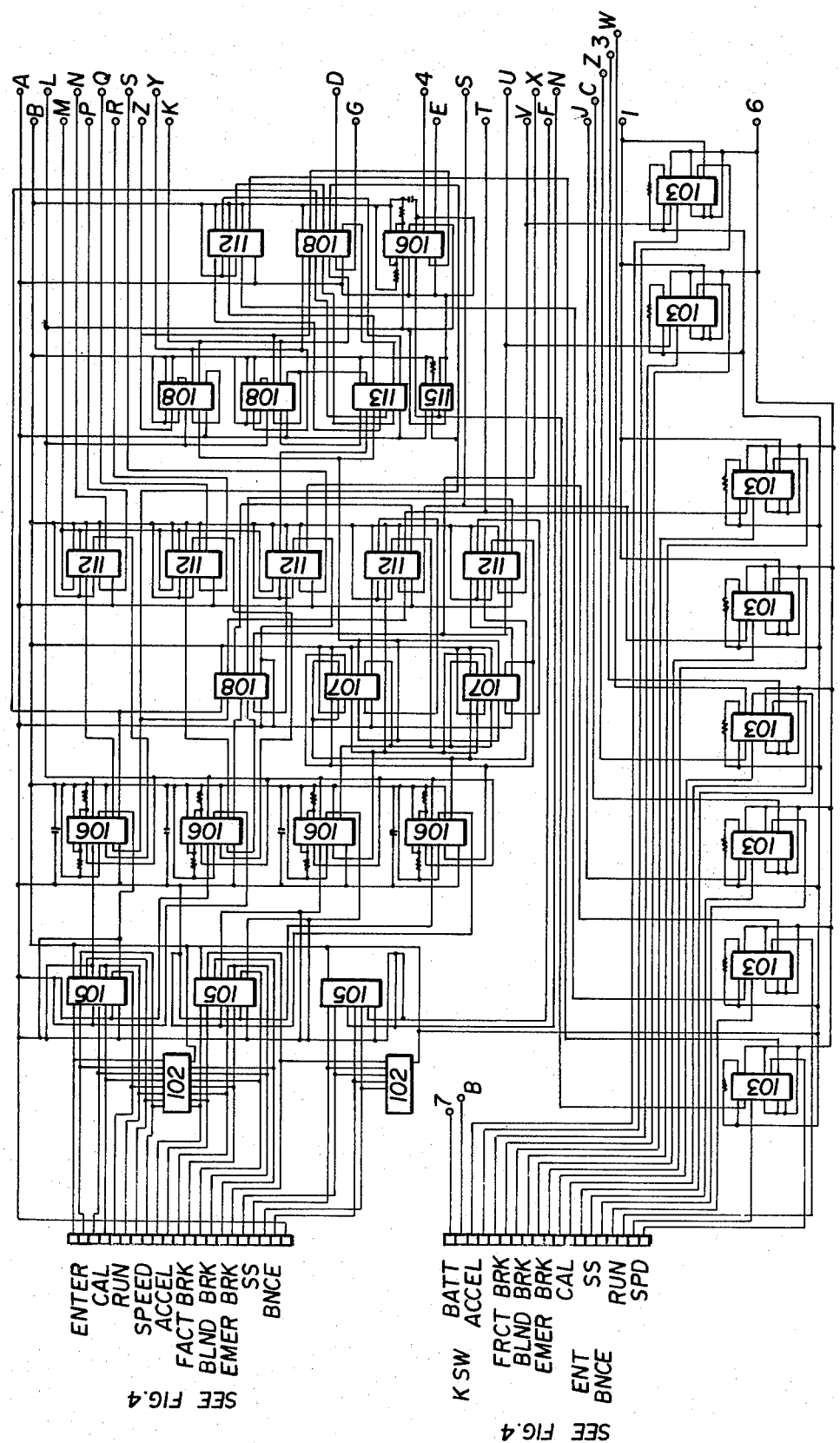
FIGS. 6 and 7 each show portions of the pushbutton board schematic.
Figure 7:
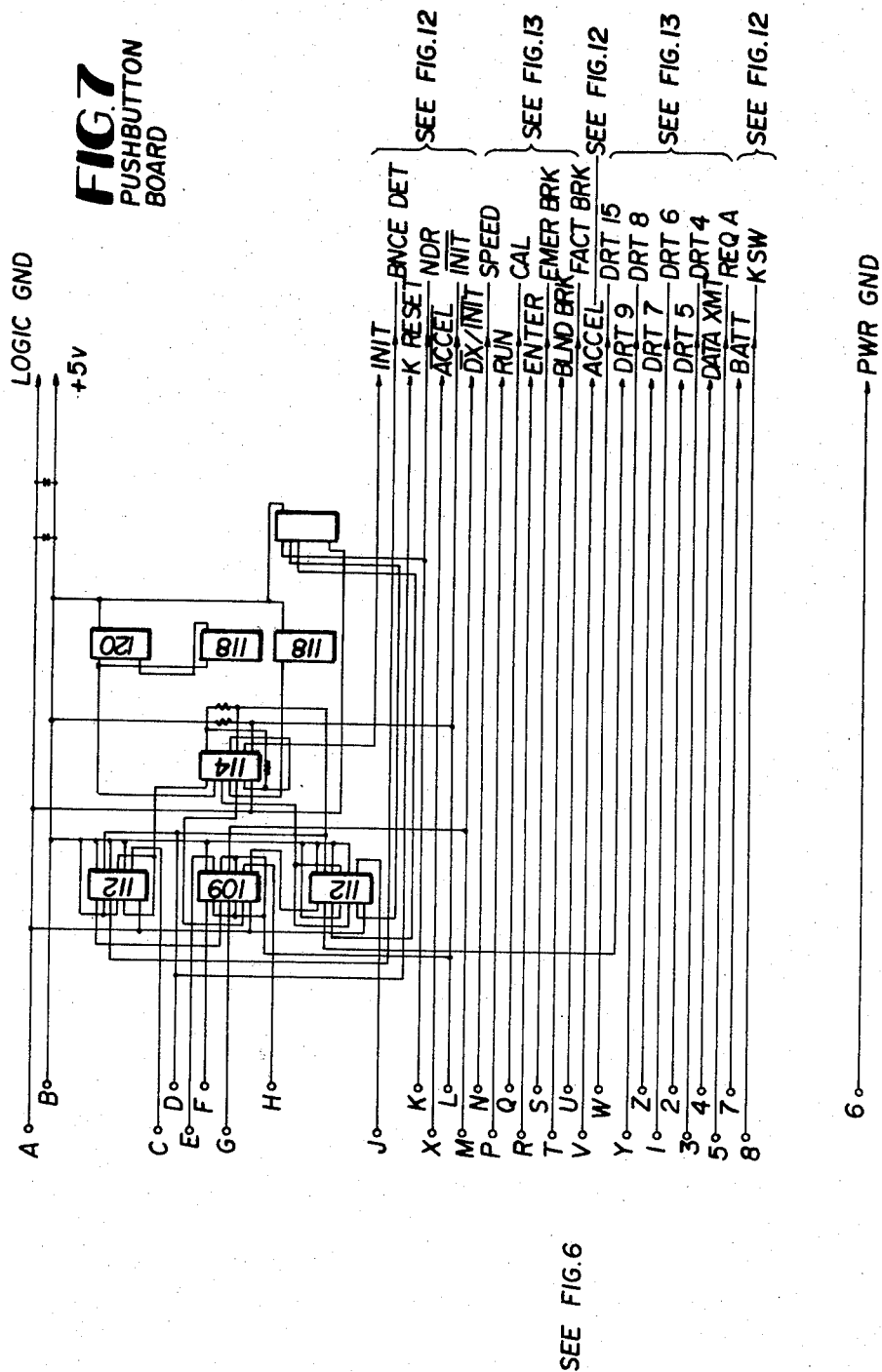
Figure 8:
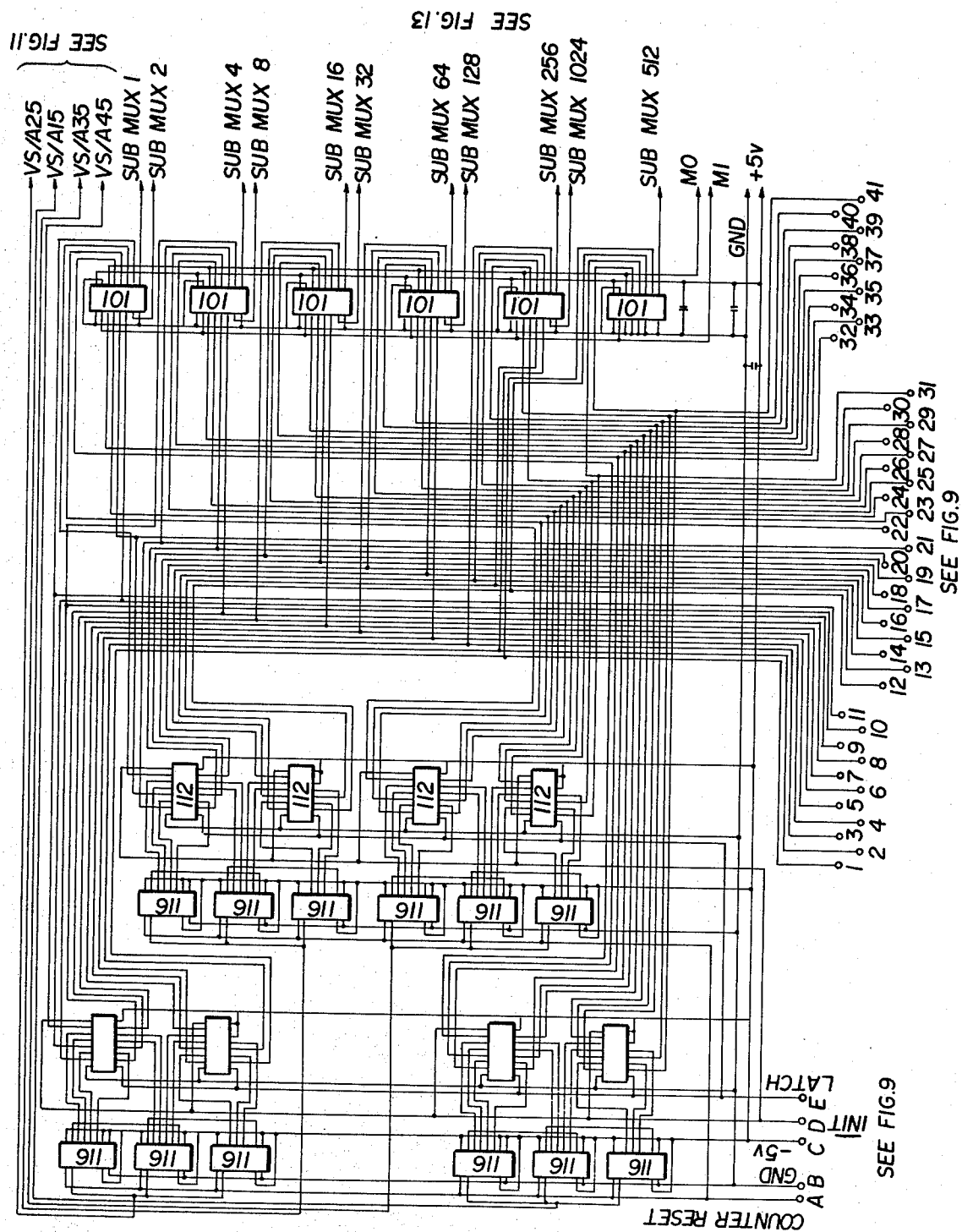
FIGS. 8 and 9 each show portions of the speed board schematic.
Figure 9:
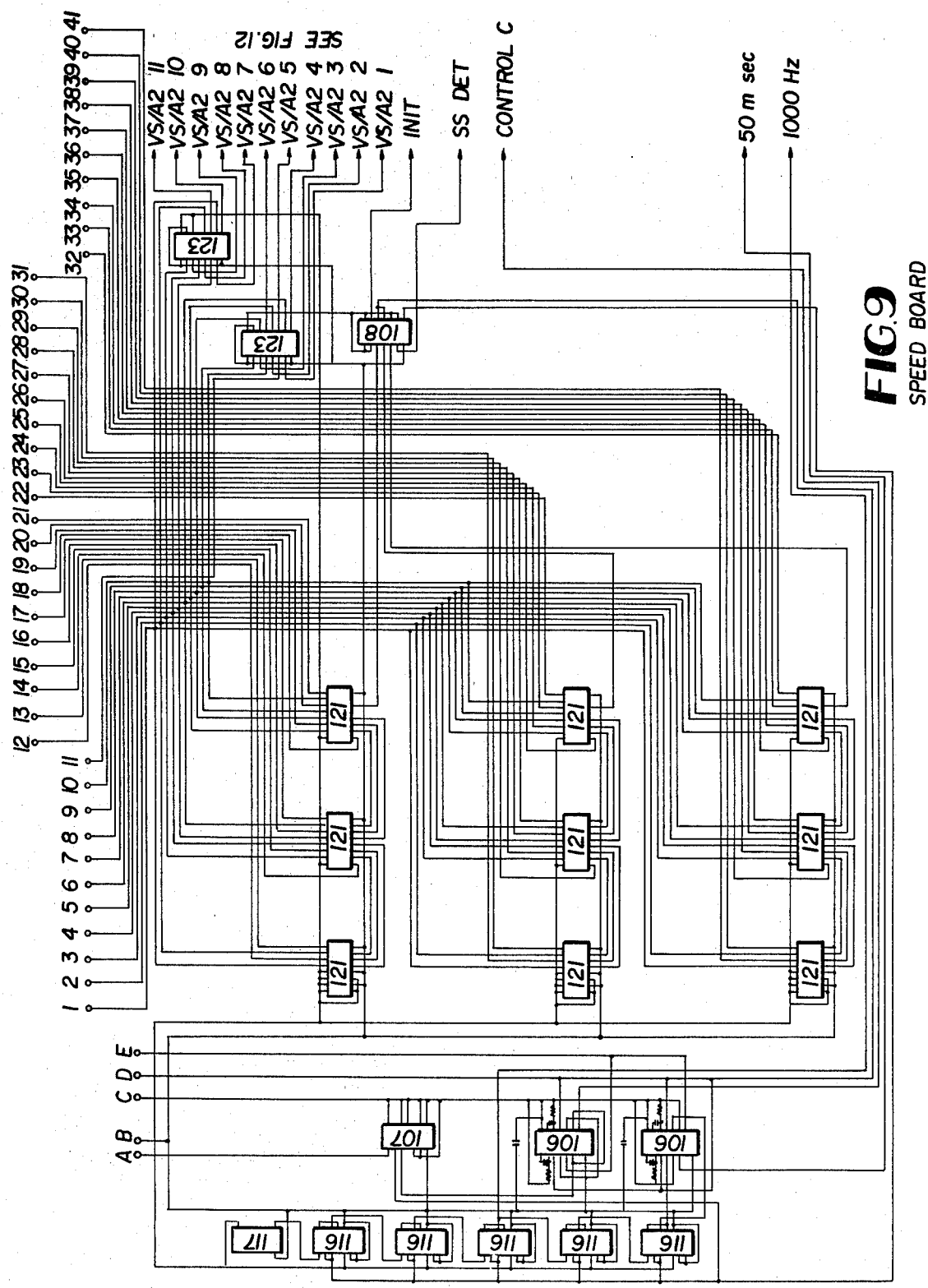

The pushbutton board of FIGS. 6 and 7 conditions the input from the front panel pushbutton switches and provides drive logic for the indicators located within the pushbuttons. Pushbutton commands and indicator activation are interfaced to the microprocessor by the parallel interface input and output registers, respectively. The pushbutton board also contains two 400 Hz audible alarms for indicating invalid test conditions. One alarm is activated if there is a speed difference among any one of four driven vehicle axles, referred to as a slip or slide. The other alarm is activated if the overhead pantograph connection to 600 volts is interrupted, referred to as a pantograph bounce. The alarm activation commands originate from the speed board and the control board, respectively.

The pushbutton board is comprised of power drivers 103, debounce circuit 105, monostable multivibrators 106, flip-flops 112, inverters 113 and inverting buffer 114, a timer oscillator 115, audible alarms 118, a flasher module 120. Also included are gate chips 107, 108, 109 which are comprised of NOR, NAND, AND gates, respectively.

The speed board contains the system clock and the vehicle speed measuring circuitry. The clock is comprised of a 1 MHz crystal controlled oscillator 117 and five digital decade counters 116. It generates 50 ms interrupts for the microprocessor software, in addition to a 100 ms time base and a 1000 KHz calibration signal for the speed measuring circuitry. The 100 ms time base is the result of the required system speed accuracy, ±0.5 MPH. The speed measuring circuitry consists of four digital counters, chips 116 with flip-flops 112, three digital comparators 121 and a 4-channel 16 bit digital multiplexer 101. Also included are multivibrators 106, NOR gates 107, NAND gates 108 and bus driver 123. The counters convert pulses sensed per axle revolution into pulses per 100 ms for each of the four vehicle axles. The pulse per 100 ms information from one axle (reference axle) is input to the microprocessor as a 12 bit word via the parallel interface, and manipulated by software to yield vehicle speed in miles per hour. The comparators compare the pulse per 100 ms information from the remaining three axles to the reference axle. If there is a discrepancy of two or more pulses per 100 ms between any axle and the reference, the comparator circuitry interrupts the microprocessor. Software commands the multiplexer to read into the microprocessor all four 12 bit axle speed words, and compare them with a preset software discrepancy limit. If the discrepancy limit is exceeded, a wheel slip or slide is present and the microprocessor activates the proper alarm on the pushbutton board.

The analog board conditions all the analog transducer signals from the vehicle under test. It contains: differential amplifiers, calibration logic, precision voltage sources, pulse shaping circuitry, frequency-to-voltage converters and system mode logic. The differential amplifiers are used to: minimize noise from the data signals, provide MPIP isolation from the test vehicle, and normalize all transducer full scale outputs to 2.0 volts. The calibration logic is comprised of MOS analog switches which are connected to the differential amplifier inputs. Either the transducer signals or the precision voltage sources are routed through the switches for data acquisition or calibration, respectively. For the brake pressure transducers, switches connect a ±0.1 percent R-CAL resistor across one leg of the transducers Wheatstone bridge. The calibration logic is commanded by the microprocessor software via the parallel interface output register. Three precision voltage regulators and three adjustable voltage dividers provide six calibration sources accurate to ±0.1 percent per calibration for all analog transducers (except brake pressure). The conditioned analog transducer signals are routed from the analog board directly into the third interface, the data acquisition sub-system, for A to D conversion and input to the microprocessor. They are also input to the trace blanking circuitry on the control board which is connected to the oscillograph signal inputs.

The pulse shaping circuitry consists of diode clamps, differential amplifiers, and threshold detectors. It converts the spikes from the four vehicle axle speed magnetic pickups into logic level square pulses. The threshold detector reference is 0.25 volts to eliminate erroneous pulse generation by noise. The logic level speed pulses are input to the speed board digital counters and to the frequency-to-voltage (F to V) converters. The F to V converters provide analog speed signals to the oscillograph for each of the four axles. Calibration logic for the speed signals is comprised of digital gates connected to the F to V converter inputs. The logic level speed pulses are gated to the F to V converters for data acquisition or the 1 KHz signal from the system clock is routed to the F to V converters for calibration.

Figure 10:
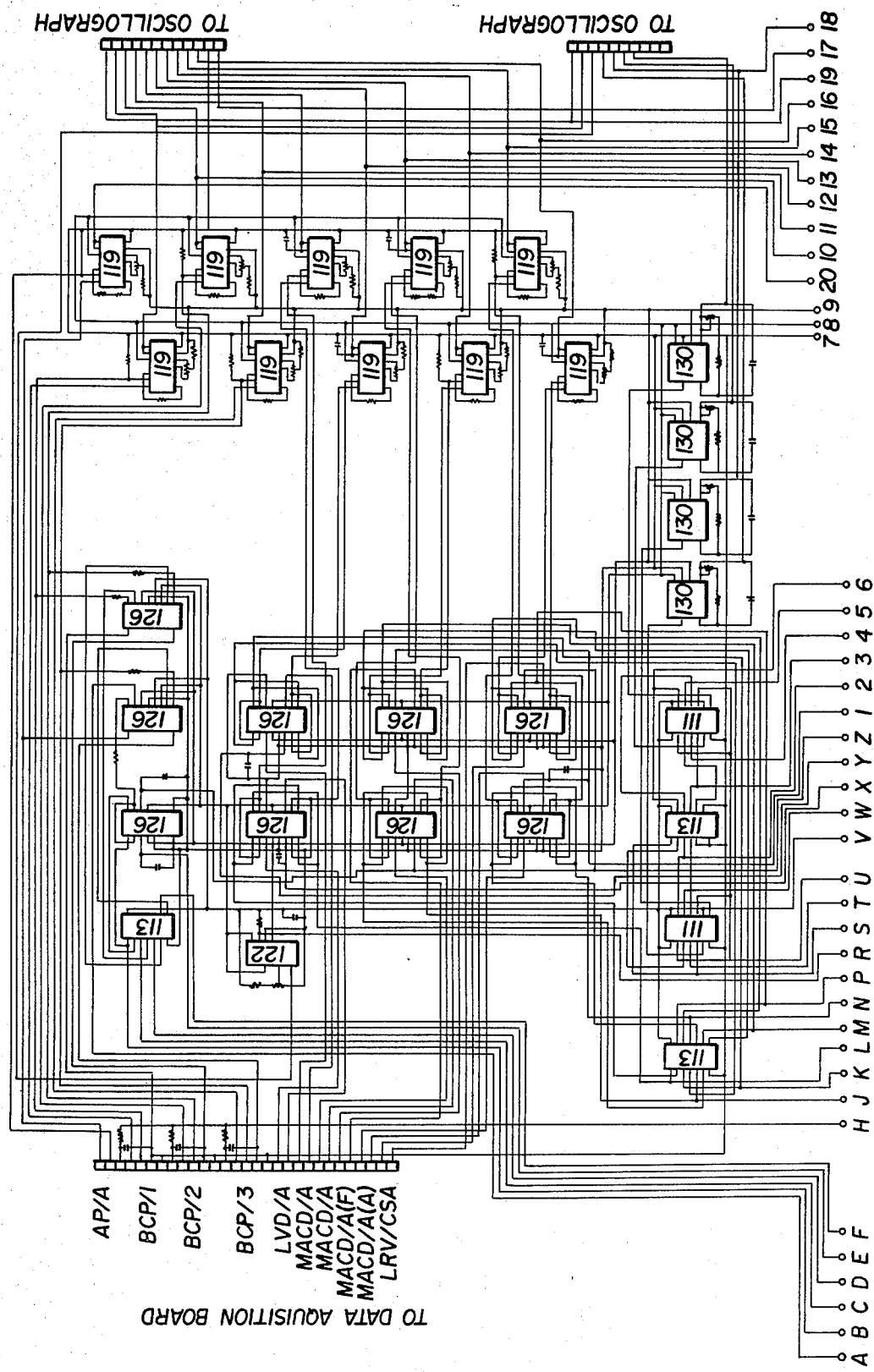
FIGS. 10 and 11 each show portions of the analog board schematic.
Figure 11:
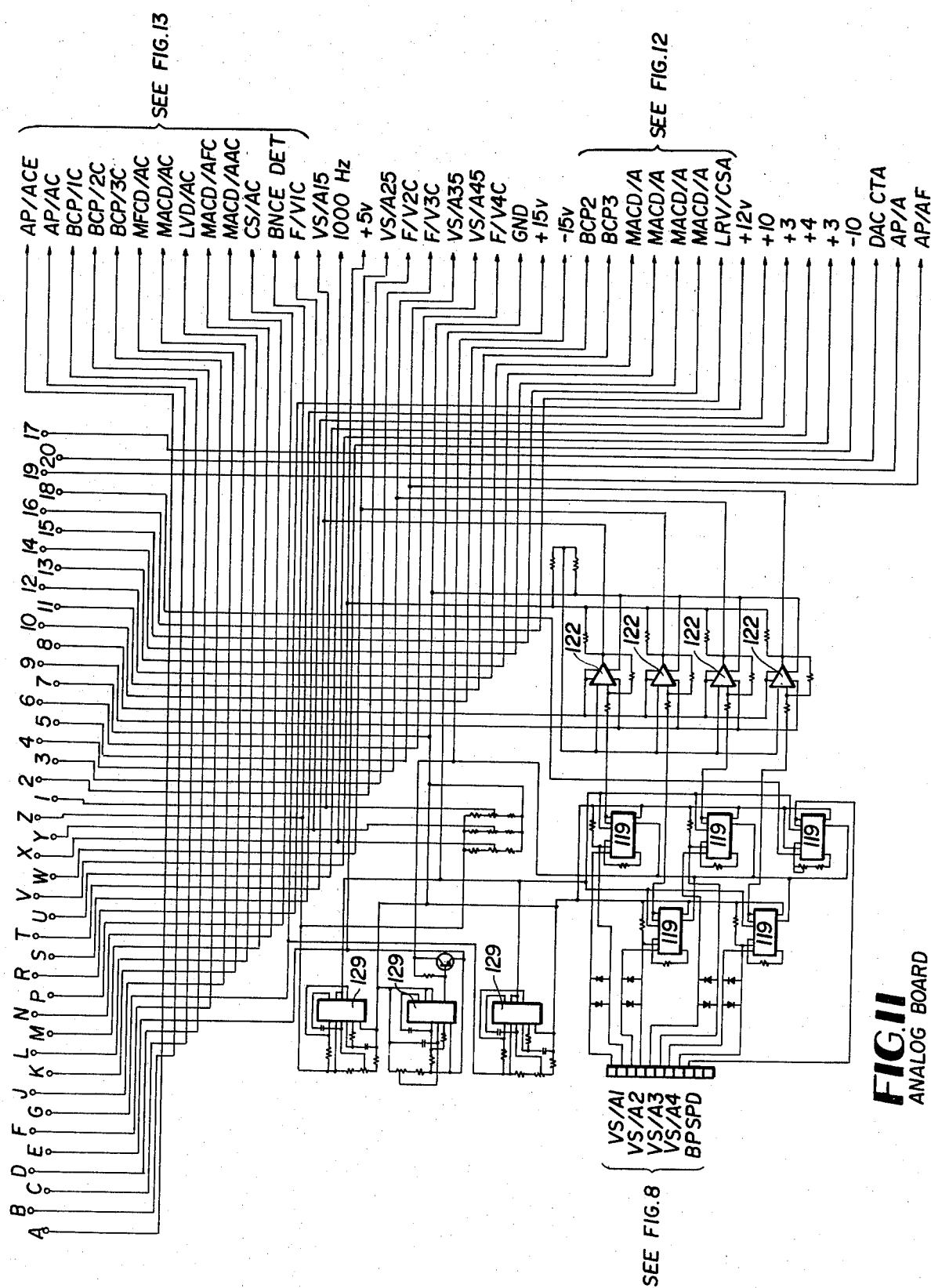

The system mode logic controls 1 bit in the parallel interface output register to indicate the status of system calibration. It consists of four nickel-cadmium batteries, their associated charging circuitry and a CMOS flip-flop. The flip-flop, under continuous battery power, sets the mode bit once system calibration has been completed. Abnormal interruptions of power to the microprocessor unit do not affect the status of the bit. Bit reset is accomplished only by a normal microprocessor unit power-off. As shown in FIGS. 10 and 11 the analog board is comprised of two AND-OR-INVERT 111, inverters 113, single-pole single-throw switch 126, frequency-to-voltage converters 130, an isolation amplifier 119, a voltage comparator 122 and a voltage regulator 129.

The control board is the buffer between the special function circuitry and the parallel interface. It consists of a four word × 16 bit main input multiplexer, 37.5 to 5 volt level shifters, and control logic for: system calibration, the oscillograph, and the two sub-multiplexers located on the thumbwheel and speed boards, respectively. The main multiplexer and the sub-multiplexer control logic permit pushbutton (9 bits), thumbwheel (58 bits), axle speed (48 bits), and master control loop position (6 bits), information to be channeled into the 16 bit input register of the parallel interface. All three multiplexers are commanded by the microprocessor via the parallel interface. The main multiplexer is commanded by 2 bits in the control/status register and the sub-multiplexers are commanded by 2 bits in the output register. The level shifters convert master control loop command and vehicle direction logic levels into microprocessor logic levels. Calibration control logic decodes 4 bits in the parallel interface output register to 15 transducer signal calibration commands, which are fed to the calibration logic on the analog board. The oscillograph control logic activates the oscillograph paper drive, places an event marker on the oscillograph, and displays/blanks the appropriate signals on the oscillograph as a function of the vehicle tested. Three bits in the parallel interface output register operate the oscillograph control logic.

The oscillograph used for testing is a Honeywell cathode ray tube visicorder equipped with 18 interface modules. It uses the light from a fiber optic cathode ray tube to record up to 18 simultaneous data channels on moving 8-inch wide photosensitive paper. Frequency response is DC to 5000 Hz. The interface modules accept the high level data signals from the microprocessor unit oscillograph connector and condition these signals for each oscillograph channel. The interface modules have a sensitivity of 1 volt per inch trace deflection.

Figure 12:
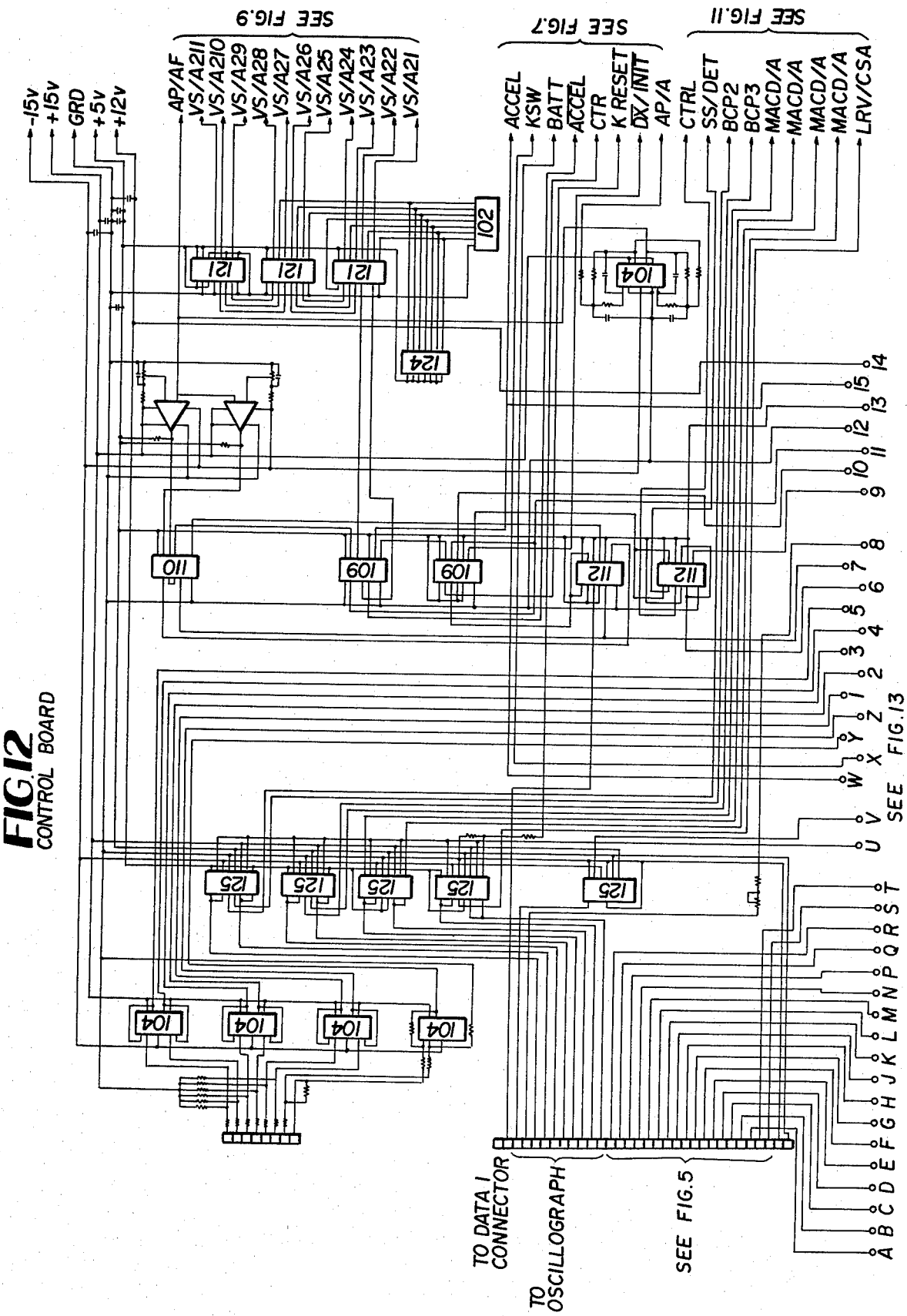
FIGS. 12 and 13 each show portions of the control board schematic.
Figure 13:
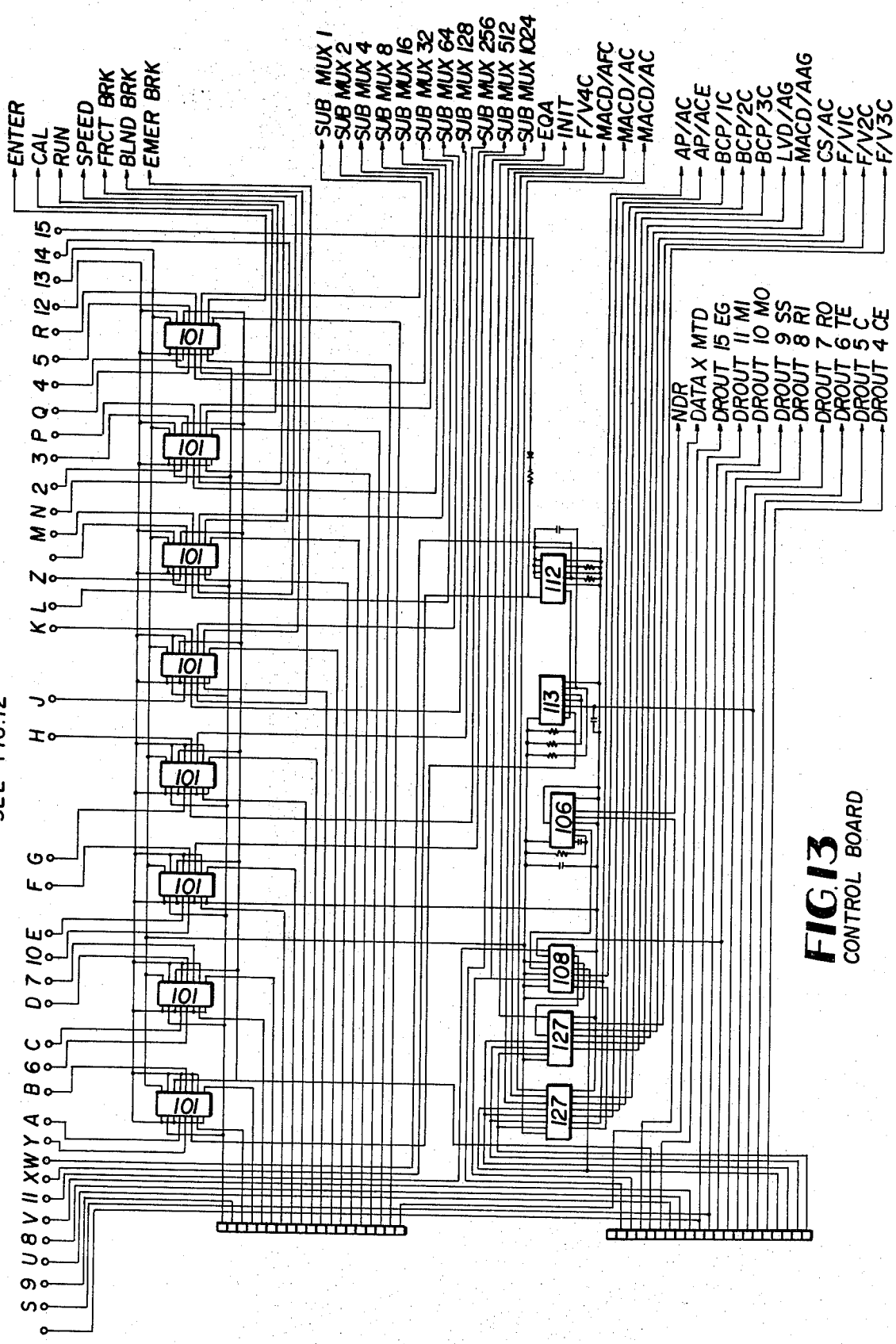
Figure 14:
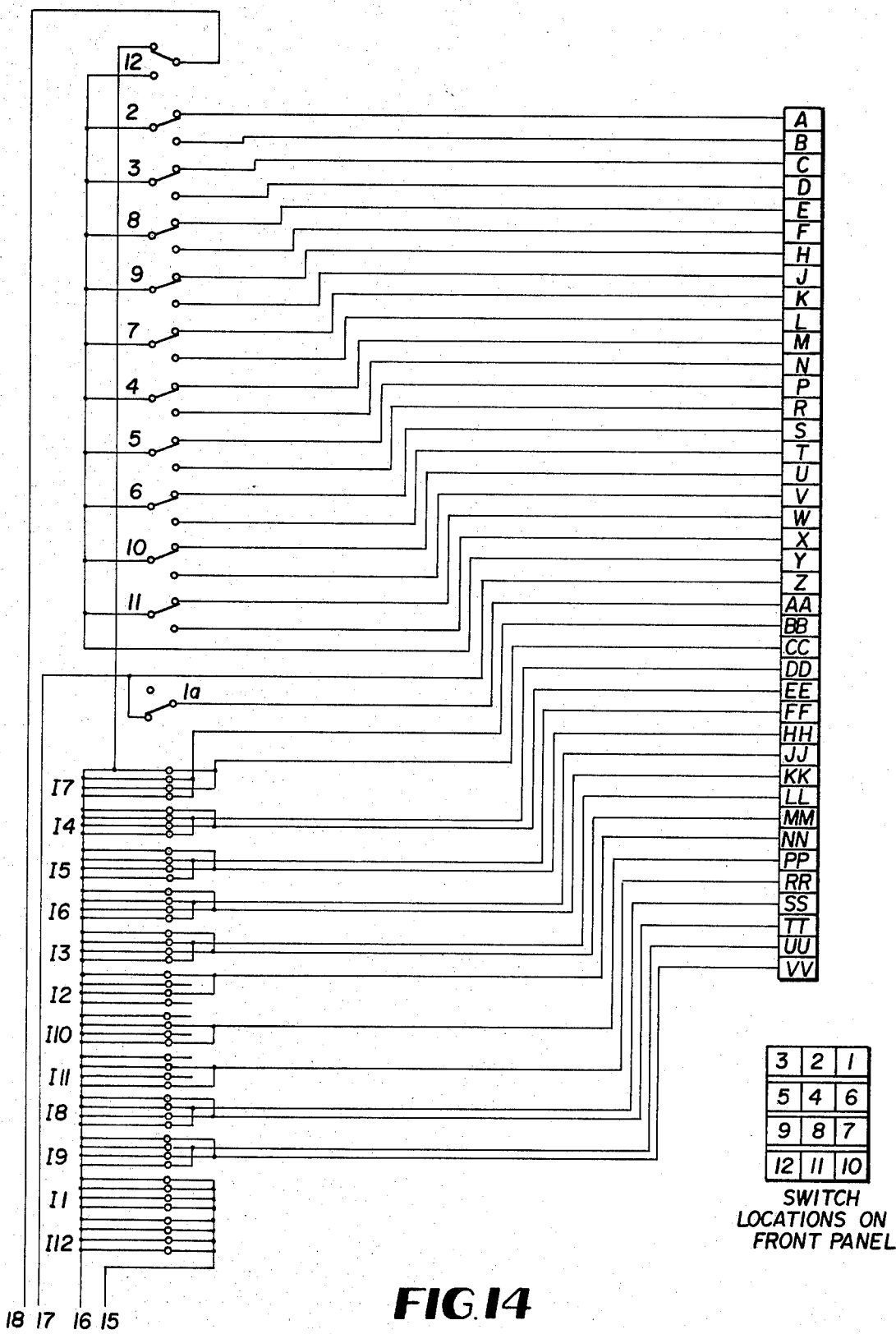
FIG. 14 shows the interconnections of the pushbutton board.
Figure 15:
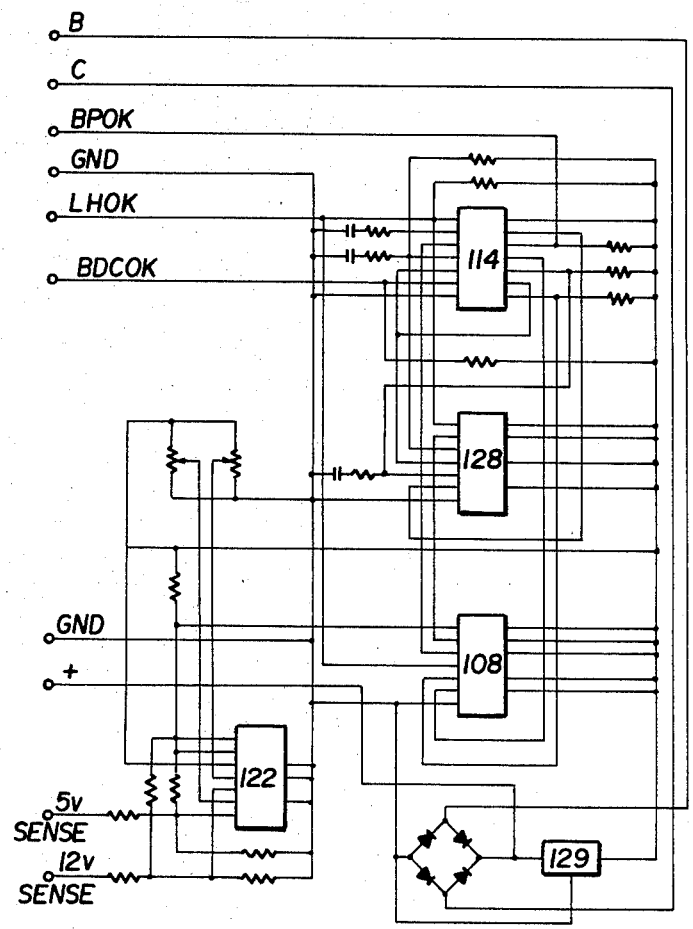
FIG. 15 depicts the power fail schematic.

As seen in FIGS. 12 and 13 the control board is comprised of multiplexer 101, operational amplifier 104, monostable multivibrator 106, dip switch 124, and double-pole single-throw switch 125. Also included are NAND, AND, OR gate chips represented by 108, 109, and 110, respectively. Further included are flip-flop 112, inverters 113, and comparator circuits 121.

The power fail board generates two sequenced logic signals which are transmitted directly to the microprocessor for proper system start-up and retention of software in memory if AC or DC power is lost. A power fail software routine is initiated by the logic signals if the AC input to the microprocessor unit drops to 98 volts or if either the plus 5 or plus 12 volt DC power supplies drop by five percent.

The power fail board as shown in FIG. 16 is comprised of a comparator 121, a Schmitt trigger 128, an inverting buffer 114, and a NAND gate circuit 108.

DC power for the microprocessor and the special function circuitry is provided by a 40 KHz switching regulated power supply. Four DC voltages: plus five, plus 15, minus 15, plus 12 and an AC power fail signal, which is fed to the power fail board, are developed by the supply. The unit is 80 percent efficient with a total power output capability of 375 watts.

A 5×7 dot matrix printer is used for data and system message output. The unit prints 18 characters per line on standard 2¼ inch adding machine paper and is supplied with its own character generator and drive logic board. The printer data buffer is fed by the serial interface 8 bit output register at a transmission rate of 1200 bits per second. Character information is presented in 7 bit ASCII format with one parity check bit (8 bits).

As an aid in interpreting the various board schematics, the following functions are associated with the disclosed integrated circuit chip members.

Chip numbers:
101 decoder/multiplexer
102 resistor
103 power driver
104 operational amplifier
105 debounce circuit
106 monostable multivibrator
107 NOR
108 NAND
109 AND
110 OR
111 AND-OR-INVERT
112 D type flip-flop
113 inverter
114 inverting buffer
115 timer oscillator
116 counter
117 1 MHz oscillator
118 audible alarm
119 isolation amplifier
120 flasher module
121 comparator
122 voltage comparator
123 bus driver circuit
124 dip switch
125 double-pole, single-throw
126 single-pole, single-throw
127 BCD to decimal decoder
128 Schmitt trigger
129 voltage regulator
130 frequency-to-voltage converters

MICROPROCESSOR UNIT FUNCTIONAL DESCRIPTION

Figure 4:
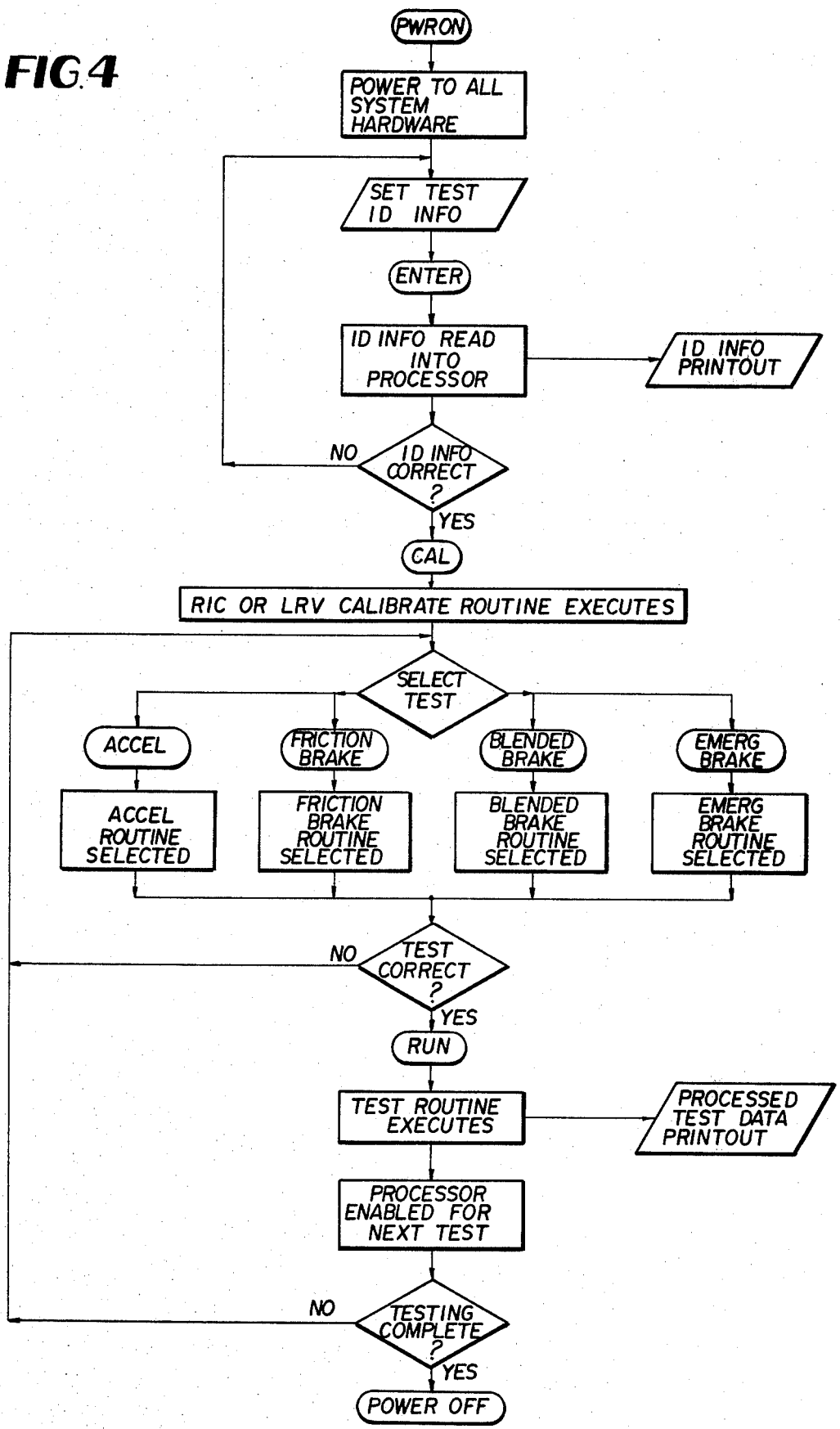
FIG. 4 is a flow diagram of the MPIP test procedure.

MPIP operation is divided into three areas: initialization, calibration, and test/run. System operation is directed from the front panel illuminated pushbutton switches, and is accomplished by hardware under software control. FIG. 3 illustrates the pushbutton layout and FIG. 4 shows a simplified MPIP operational flow diagram.

Initialization

Initialization includes powering-up the microprocessor unit, enabling the microprocessor to accept commands, and entering test identification information. The microprocessor unit is powered-up by pressing the POWER-ON pushbutton, which illuminates red to indicate system power. A normal power-up initialization cycle begins with the microprocessor commanding the printer to output the system message "STS MPIP V-01A." This verifies the version of software stored in the program portion of memory. After the message has been printed, the microprocessor illuminates the ENTER pushbutton green; directing the operator to enter the test identification information. The operator sets the thumbwheel switches for customer, vehicle number, date, time and run number; and inputs this information by pressing the ENTER pushbutton. The microprocessor stores the test identification information in the data portion of memory and commands the printer to output the information for operator inspection. The initialization cycle ends with the microprocessor illuminating the CAL pushbutton green. The ENTER pushbutton is still illuminated green to allow re-entering the thumbwheel data in the event of an operator error on the first entry. CAL is illuminated green for continued system operation.

The POWER-ON pushbutton applies power to all system hardware and activates the power-fail logic which provides start up signals to the microprocessor. The signals initiate a ROM stored microcode sequence that commands execution of the MPIP power-up software routine. This routine checks the status of the system mode bit to determine if power-up is normal or power-failed. A start routine is initiated if power-up is normal, which is defined as applying power with the POWER-ON pushbutton, or a power interruption before system calibration is complete. A power-fail routine is initiated if power is interrupted after system calibration is complete. Both the start routine and the power-fail routine cause the microprocessor to reset all registers and logic for accepting system commands. Under start routine control: the message "STS MPIP V-01A" is printed and the ENTER pushbutton is illuminated green. Under power-fail routine control: the message "POWER FAIL" is printed and the 4 test pushbuttons are illuminated green. The software routines set and reset bits internal to the microprocessor and in the output register of the parallel interface to enable commands and illuminate pushbuttons. Each message is contained in its respective routine, and is sent to the printer character generation logic in a serial 8 bit stream via the serial interface.

Test identification information is entered at the conclusion of a normal power-up sequence by pressing the ENTER pushbutton, which generates the "enter" command. The "enter" command interrupts the microprocessor and initiates an interrupt service routine which interrogates the parallel interface input register. The enter bit, set in the input register, selects the enter sub-routines which manipulate bits in both the parallel and serial interfaces. The sub-routines accomplish the following: sequence the thumbwheel board multiplexer, write test identification information into the microprocessor, start generation of real time from system clock pulses, command the printer to output test identification information, provide the oscillograph with data signals for the vehicle under test, illuminate the ENTER and CAL pushbuttons green, and enable the microprocessor to accept either an "enter" or "cal" command.

Calibration

System calibration is performed with all transducers sensing zero data. It is executed by pressing the CAL pushbutton, which indicates calibration by changing color from green to white. The calibration cycle begins with the microprocessor starting the oscillograph drive. Zero data for all parameters is recorded on the oscillograph, and is stored in the data portion of memory. After 5 seconds of zero data, the microprocessor commands each parameter to be calibrated for 1 second, sequentially. The calibrations are recorded on the oscillograph, and scale factors for each parameter are calculated and also stored in the data portion of memory. The calibration cycle ends with the microprocessor stopping the oscillograph, extinguishing illumination of the CAL pushbutton, and illuminating the 4 test pushbutton green.

The CAL pushbutton generates the "cal" command which interrupts the processor, initiates an interrupt service routine, and sets 1 bit in the parallel interface input register. The cal bit selects execution of the main calibration software routine which directs a number of subroutines to accomplish the following: indicate calibration operation, drive the oscillograph, command the calibration logic, calculate zeros and scale factors, extinguish illumination of the CAL pushbutton, and illuminate the four test pushbuttons. All of the above tasks, except for the calculation of zeros and scale factors, are performed by sub-routines that set or reset bits in the parallel interface output register. The calculation of zeros and scale factors requires subroutines that control the data acquisition interface, perform arithmetic functions and store information in memory.

The calculation of zeros is accomplished by sequencing the multiplexer on the data acquisition interface through each active vehicle parameter channel, and commanding an A to D conversion for the respective zero data inputs. The digital zero values are stored in memory to be used as zero offset factors for the calibration and data signals. Calculation of scale factors requires simultaneous sequencing of the data acquisition interface multiplexer and the calibration logic, and conversion of the calibration signals into digital values. Scale factors are obtained by subtracting the zero offset values from the calibration values digitally, and equating the results to numerical constants in the MPIP software. The constants are the engineering unit equivalents for the calibration signals. Thus, at the conclusion of the calibration cycle, values are available in memory for zero offset correction and engineering unit conversion of all vehicle parameter data.

Test/Run

Production vehicle acceptance data is acquired in the test/run mode. A specific test is selected by pressing one of the 4 illuminated green test pushbuttons: ACCEL, FRICTION-BRAKE, BLENDED-BRAKE, EMERG-BRAKE: and executed by pressing the illuminated green RUN pushbutton. The selected test pushbutton and the RUN pushbutton change color from green to white to indicate execution. Each test data acquisition cycle begins with the microprocessor starting the oscillography drive at a specific vehicle speed. This provides a continuous record of all data signals for each test, as required by vehicle customers. Event marks are placed on the oscillograph record by the microprocessor for each major data acquisition occurrence. As a function of test selected, either time after first vehicle motion, master control loop command, or speed is sensed by the microprocessor to initiate sampling of the test parameter data. The microprocessor processes the data by averaging a number of data samples, correcting the averaged samples for zero engineering units. At the conclusion of the data acquisition cycle, the microprocessor outputs the processed test data on the printer with the test identification information as a heading, stops the oscillograph drive, and re-illuminates the 4 test pushbuttons green.

There are 8 test data acquisition cycles in the MPIP software. They are identified as: acceleration, friction brake, blended brake, and emergency brake tests for each of the two types of vehicles tested, the RTC and the SLRV. Each cycle is comprised of a main software control routine and a number of sub-routines which manipulate the 3 hardware interfaces and memory. The sub-routines function similar to those described in the initialization and calibration sections.

The SLRV blended brake test exemplifies a typical test data acquisition cycle. Its main control routine has 11 stages which are executed in sequence to provide the acceptance data required for LRV blended braking. The 11 stages in sequence are as follows:
1-SENSE AXLE SPEED=20 MPH
   Start Sampling Master Control Loop Command
   Start Oscillograph Drive 2-SENSE MASTER CONTROL LOOP COMMAND=50% BRAKE
  Start Sampling Deceleration
  Start Clock Timing
  Oscillograph Event On
3-SENSE DECELERATION=0.7 MPHPS (Miles Per Hour Per Second)
  Start Averaging Samples of Deceleration
  Determine Axle Speed in MPH (Brake Entry Speed)
  Oscillograph Event Off
4-SENSE TIME=1 SECOND FROM 0.7 MPHPS POINT
  Stop Averaging Samples of Deceleration
  Divide Deceleration Average by 1 Second to Yield Jerk Rate in MPHPSPS (Miles Per Hour Per Second Per Second)
  Store Jerk Rate Value
  Oscillograph Event Off
5-SENSE TIME=2 SECONDS FROM 0.7 MPHPS POINT
  Start Averaging Samples of Deceleration
  Start Averaging Samples of 3 Brake Pressures
  Oscillograph Event Off
6-SENSE AXLE SPEED=50% OF STORED BRAKE ENTRY SPEED
  Determine Motor Armature Current in Amps
  Determine Motor Field Current in Amps
  Determine Line Voltage in Volts
  Determine Master Control Loop Command in Percent
  Store Armature and Field Current, Line Voltage, and Master Control Loop Command Values
  Oscillograph Event On
7-SENSE AXLE SPEED=5 MPH
  Stop Averaging Samples of Deceleration
  Determine Deceleration in MPHPS
  Store Deceleration Value
  Oscillograph Event Off
8-SENSE CAR STOPPED
  Stop Clock Timing
  Determine Time Duration in Seconds
  Stop Averaging Samples of 3 Brake Pressures
  Determine Brake Pressures in PSI
  Store Time Duration and Brake Pressure Values
  Oscillograph Event On
9-SENSE TIME=5 SECONDS FROM CAR STOP
  Oscillograph Event Off
  Stop Oscillograph Drive
10-COMMAND PRINTER TO OUTPUT
  Test Identification Information Header
  Brake Entry Speed
  Jerk Rate
  Motor Armature Current
  Motor Field Current
  Line Voltage
  Master Control Loop Command
  Deceleration
  3 Brake Pressures
  Vehicle Stopping-Time Duration
11-ILLUMINATE 4 TEST PUSHBUTTONS GREEN There are 3 pushbuttons which are activated in the test/run mode once the RUN pushbutton has been pressed. They are SPEED, SLIP-SLIDE and BOUNCE. The SPEED pushbutton commands an instantaneous print out of vehicle speed. The SLIP-SLIDE pushbutton silences the steady 400 Hz. audible alarm generated for a wheel slip or slide. The BOUNCE pushbutton silences the alternating 400 Hz audible alarm generated for a pantograph bounce.

The invention relates to preferred exemplary embodiments of the invention, it being understood that other embodiments and variants thereof are possible within the spirit and scope of the invention, the latter being defined by the appended claims.

What is claimed and desired to be secured by Letters Patent of the United States is:

1. A vehicle electronic testing device providing vehicle parameter data of a vehicle comprising:
    a control board, wherein the control board includes a multiplexer to multiplex information entering the control board;
    a thumbwheel board connected to the control board, wherein the thumbwheel board is manually operated to enter vehicle data regarding identification of the vehicle and wherein the thumbwheel board generates signals containing vehicle identification information;
    a speed board connected to the control board, wherein the speed board measures vehicle speed and generates vehicle speed information;
    an analog board connected to the control board, wherein the analog board differentially amplifies information signals applied thereto and wherein the analog board is further connected to and receives information from the speed board;
    a pushbutton board connected to the analog board, wherein the pushbutton board is manually operated to control the electronic testing device and generates information indicating pushbutton board operation and wherein the pushbutton board is further connected to and receives information from the control board;
    a first data source connected to the control board, wherein the first data source provides information comprised of a first set of parameter data;
    a second data source connected to the analog board, wherein the second data source provides information comprised of a second set of parameter data;
    a microprocessor, wherein the microprocessor is connected to and receives information from the control board and wherein the microprocessor converts the information into signals representing engineering unit values and wherein the microprocessor generates the signals representing engineering unit values;
    a voltage supply to provide power to the vehicle electronic testing device;
    a power failure board, wherein the power failure board is connected to the microprocessor and to the voltage supply and wherein the power failure board indicates power failure of the voltage supply during vehicle parameter testing;
    a parallel interface circuit, wherein the parallel interface circuit is connected to the microprocessor and to the control board; and
    a display, wherein the display is connected to and receives signals representing engineering unit values from the microprocessor, and wherein the values of engineering units which are represented by signals from the microprocessor are indicated by the display.

2. A vehicle electronic testing device according to claim 1, wherein the thumbwheel board comprises a plurality of interconnected binary-coded-decimal switches and a plurality of multiplexers.

3. A vehicle electronic testing device according to claim 1, wherein the pushbutton board comprises a plurality of interconnected power drivers, debounce circuits, monostable multivibrators, D flip-flops, inverters, audible alarms and flasher module.

4. A vehicle electronic testing device according to claim 1, wherein the speed board comprises a plurality of interconnected D flip-flops, counters, multiplexers, comparators and a singular bus driver circuit.

5. A vehicle electronic testing device according to claim 1, wherein the analog board comprises a plurality of interconnected AND-OR-INVERT circuits, inverters, frequency-to-voltage converters, single-pole single-throw switches, isolation amplifiers, voltage regulators, and voltage comparators.

6. A vehicle electronic testing device according to claim 1, wherein the control board comprises a plurality of interconnected multiplexers, amplifiers, double-pole single-throw switches, D flip-flops, comparators, binary-to-decimal decoders, and a singular dip switch, inverter, and monostable multivibrator.

7. A vehicle electronic testing device according to claim 1, wherein the power fail board comprises the interconnection of a voltage regulator, Schmitt trigger, comparator, and an inverting buffer.

8. A vehicle electronic testing device according to claim 1, wherein the thumbwheel board comprises the interconnection of a plurality of binary-coded-decimal switches and a plurality of multiplexers and also wherein the control board comprises the interconnection of a plurality of multiplexers, amplifiers, double-pole single-throw switches, D flip-flops, comparators, binary-to-decimal decoders and a singular dip switch, inverter, and monostable multivibrator, such that the control board and the thumbwheel board are connected to and receive information from each other.

9. A vehicle electronic testing device according to claim 1, wherein the pushbutton board comprises the interconnection of a plurality of power drivers, debounce circuits, monostable multivibrators, D flip-flops, inverters, audible alarms and flasher module and also wherein the control board comprises the interconnection of a plurality of multiplexers, amplifiers, double-pole single-throw switches, D flip-flops, comparators, binary-to-decimal decoders, and a singular dip switch, inverter, and monostable multivibrator, such that the control board and the pushbutton board are connected to and receive information from each other.

10. A vehicle electronic testing device according to claim 1, wherein the speed board comprises the interconnection of a plurality of D flip-flops, counters, multiplexers, comparators and a singular bus driver circuit, and also wherein the control board comprises the interconnection of a plurality of multiplexers, amplifiers, double-pole single-throw switches, D flip-flops, comparators, binary-to-decimal decoders, and a singular dip switch, inverter, and monostable multivibrator, such that the control board and the speed board are connected to and receive information from each other.

11. A vehicle electronic testing device according to claim 1, wherein the analog board comprises the interconnection of a plurality of AND-OR-INVERT circuits, inverters, frequency-to-voltage converters, single-pole single-throw switches, isolation amplifiers, voltage regulators, and voltage comparators, and also wherein the control board comprises the interconnection of a plurality of multiplexers, amplifiers, double-pole single throw switches, D flip-flops, comparators, binary-to-decimal decoders, and a singular dip switch inverter, and monostable multivibrator, such that the control board and the analog board are connected to and receive information from each other.

* * * * *